(12) United States Patent
Han

(10) Patent No.: US 8,120,952 B2
(45) Date of Patent: *Feb. 21, 2012

(54) MEMORY DEVICE WITH A DECREASING DYNAMIC PASS VOLTAGE FOR REDUCING READ-DISTURB EFFECT

(75) Inventor: Jin-Man Han, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 27 days.

This patent is subject to a terminal disclaimer.

(21) Appl. No.: 12/721,693

(22) Filed: Mar. 11, 2010

(65) Prior Publication Data

US 2010/0165741 A1 Jul. 1, 2010

Related U.S. Application Data

(63) Continuation of application No. 12/141,159, filed on Jun. 18, 2008, now Pat. No. 7,719,888.

(51) Int. Cl.
*G11C 16/04* (2006.01)
(52) U.S. Cl. ......... 365/185.02; 365/185.17; 365/185.19; 365/185.25; 365/185.18
(58) Field of Classification Search ............. 365/185.17, 365/185.22, 185.19, 185.18, 185.25, 185.02, 365/185.09
See application file for complete search history.

(56) References Cited

U.S. PATENT DOCUMENTS

| | | | |
|---|---|---|---|
| 6,716,682 B1 | 4/2004 | Mouli | |
| 7,139,198 B2 | 11/2006 | Guterman et al. | |
| 7,196,930 B2 | 3/2007 | Han et al. | |
| 7,283,397 B2 | 10/2007 | Harari et al. | |
| 7,342,831 B2 | 3/2008 | Mokhlesi et al. | |
| 7,369,437 B2 | 5/2008 | Kamei | |
| 7,436,709 B2 | 10/2008 | Higashitani | |
| 7,471,565 B2 | 12/2008 | Aritome | |
| 7,495,956 B2 | 2/2009 | Fong et al. | |
| 7,719,888 B2* | 5/2010 | Han ....................... | 365/185.02 |
| 2002/0036925 A1 | 3/2002 | Tanzawa et al. | |
| 2002/0109539 A1 | 8/2002 | Takeuchi et al. | |
| 2007/0153573 A1 | 7/2007 | Fong et al. | |
| 2007/0247908 A1 | 10/2007 | Aritome et al. | |
| 2007/0291566 A1 | 12/2007 | Mokhlesi et al. | |
| 2007/0291567 A1 | 12/2007 | Mokhlesi et al. | |
| 2008/0056008 A1 | 3/2008 | Aritome et al. | |
| 2008/0094908 A1 | 4/2008 | Mokhlesi et al. | |
| 2008/0101122 A1 | 5/2008 | Kang et al. | |

OTHER PUBLICATIONS

International Search Report and Written Opinion for related PCT Application PCT/US2009/002895, dated Oct. 30, 2009 (13 pgs.).

* cited by examiner

*Primary Examiner* — Andrew Q Tran
(74) *Attorney, Agent, or Firm* — Brooks, Cameron & Huebsch, PLLC

(57) ABSTRACT

The present disclosure includes methods, devices, modules, and systems for operating memory cells. One method embodiment includes applying sensing voltages to selected access lines for sensing selected memory cells. The method also includes applying a dynamic pass voltage to unselected access lines while the sensing voltages are applied.

25 Claims, 5 Drawing Sheets

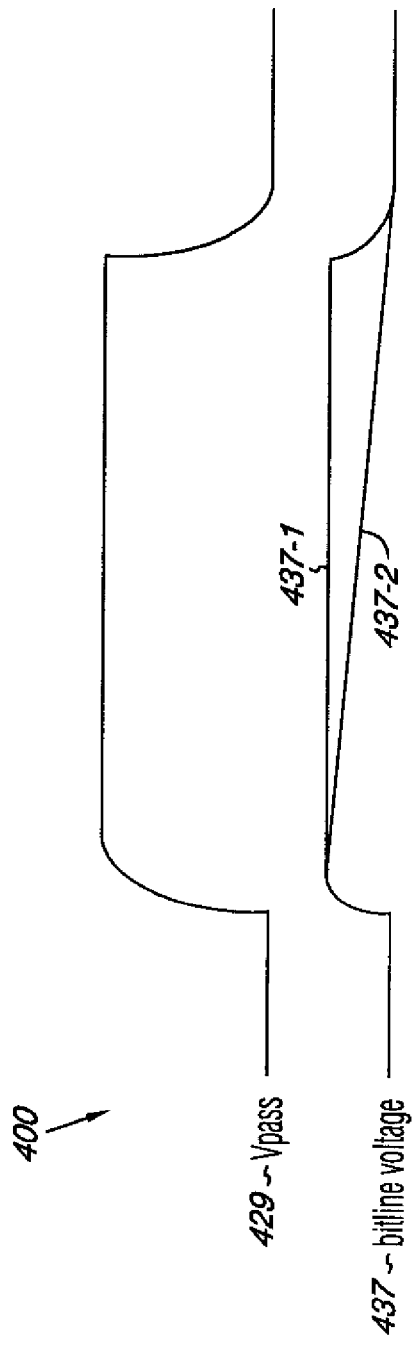

MEMORY DEVICE WITH A DECREASING DYNAMIC PASS VOLTAGE FOR REDUCING READ-DISTURB EFFECT

This application is a Continuation of U.S. application Ser. No. 12/141,159, filed Jun. 18, 2008, the specifications of which are incorporated herein by reference.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, cellular telephones, portable music players, e.g., MP3 players, and movie players. Program code and system data, such as a basic input/output system (BIOS), are typically stored in flash memory devices. This information can be used in personal computer systems, among others. Some uses of flash memory may include multiple reads of data programmed to a flash memory device without erasing the data.

Two common types of flash memory array architectures are the "NAND" and "NOR" architectures, so called for the logical form in which the basic memory cell configuration of each is arranged.

A NAND array architecture arranges its array of floating gate memory cells in a matrix such that the gates of each floating gate memory cell in a "row" of the array are coupled to an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a source line and a bit line, where the memory cells commonly coupled to a particular bit line are referred to as a "column".

Memory cells in a NAND array architecture can be programmed to a desired state. That is, electric charge can be placed on or removed from the floating gate of a memory cell to put the cell into a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multi-digit cells, or multilevel cells (MLCs). MLCs can allow the manufacture of higher density memories without increasing the number of memory cells since each cell can represent more than one digit, e.g., more than one bit. MLCs can have more than two programmed states, e.g., a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than having a charge applied to the cell during a programming operation. The other fifteen states can be referred to as "non-erased" states.

BRIEF DESCRIPTION OF THE DRAWINGS

FIG. 4 illustrates a prior art diagram of a pass voltage and bit line voltage during a sensing operation.

FIG. 5 illustrates a diagram of a dynamic pass voltage and a bit line voltage in accordance with one or more embodiments of the present disclosure.

DETAILED DESCRIPTION

Figure 1:
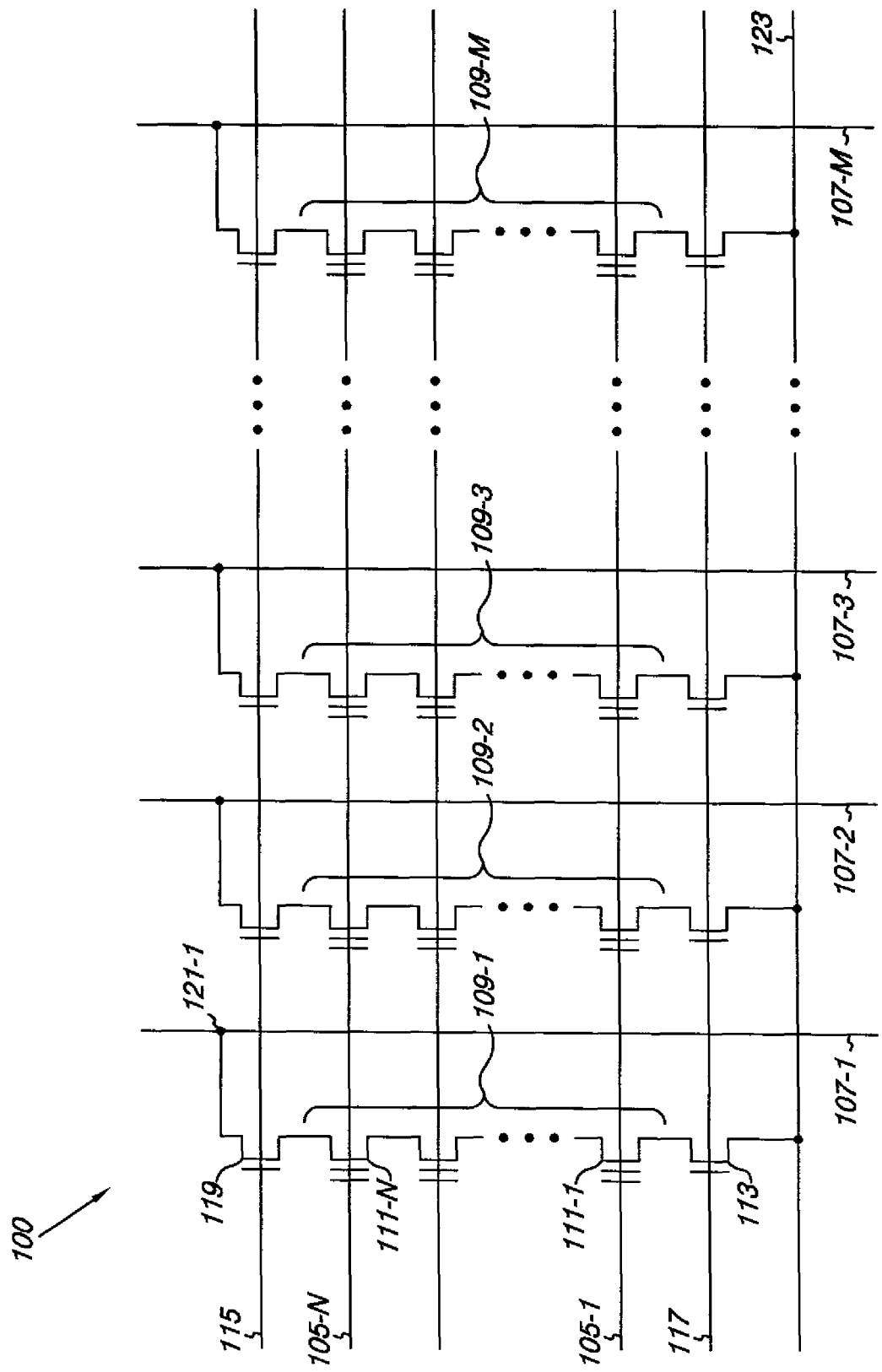
FIG. 1 is a schematic of a portion of a non-volatile memory array in accordance with one or more embodiments of the present disclosure.

The present disclosure includes methods, devices, modules, and systems for operating memory cells. One method embodiment includes applying sensing voltages to selected access lines for sensing selected memory cells. The method also includes applying a dynamic pass voltage to unselected access lines while the sensing voltages are applied.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a schematic of a portion of a non-volatile memory array 100 in accordance with one or more embodiments of the present disclosure. The embodiment of FIG. 1 illustrates a NAND architecture non-volatile memory. However, embodiments described herein are not limited to this example. As shown in FIG. 1, the memory array 100 includes access lines, e.g., word lines 105-1, ..., 105-N and intersecting data lines, e.g., bit lines 107-1, ..., 107-M. For ease of addressing in the digital environment, the number of word lines 105-1, ..., 105-N and the number of bit lines 107-1, ..., 107-M can be some power of two, e.g., 256 word lines by 4,096 bit lines.

Memory array 100 includes NAND strings 109-1, ..., 109-M. Each NAND string includes non-volatile memory cells 111-1, ..., 111-N, each associated with an intersection of a word line 105-1, ..., 105-N and a local bit line 107-1, ..., 107-M. The non-volatile memory cells 111-1, ..., 111-N of each NAND string 109-1, ..., 109-M are connected in series source to drain between a source select gate (SGS), e.g., a field-effect transistor (FET) 113, and a drain select gate (SGD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of non-volatile memory cells, 111-1, ..., 111-N, includes a source, a drain, a floating gate or other charge storage node, and a control gate. Non-volatile memory cells, 111-1, ..., 111-N, have their control gates coupled to a word line, 105-1, ..., 105-N respectively. A "column" of the non-volatile memory cells, 111-1, ..., 111-N, make up the NAND strings, e.g., 109-1, ..., 109-M, and are coupled to a given local bit line, e.g., 107-1, ..., 107-M respectively. A "row" of the non-volatile memory cells are those memory cells commonly coupled to a given word line, e.g., 105-1, ..., 105-N. A NOR array architecture would be similarly laid out except that the string of memory cells would be coupled in parallel between the select gates.

As one of ordinary skill in the art will appreciate, subsets of cells coupled to a selected word line, e.g., 105-1, ..., 105-N, can be programmed and/or sensed together as a group. A programming operation, e.g., a write operation, can include applying a number of program pulses, e.g., 16V-20V, to a selected word line in order to increase the threshold voltage (Vt) of selected cells to a desired program voltage level corresponding to a desired program state.

A sensing operation, such as a read or program verify operation, can include sensing a voltage and/or current change of a bit line coupled to a selected cell in order to determine the state of the selected cell. The sensing operation can involve biasing a bit line, e.g., bit line 107-1, associated with a selected memory cell at a voltage above a bias voltage for a source line, e.g., source line 123, associated with the selected memory cell. A sensing operation could alternatively include precharging the bit line 107-1 followed with discharge when a selected cell begins to conduct, and sensing the discharge.

Sensing the state of a selected cell can include applying one or more sensing voltages, e.g., read voltages "Vread" to a selected word line, while biasing the unselected cells of the string at one or more voltages sufficient to place the unselected cells in a conducting state independent of the threshold voltage of the unselected cells, e.g., pass voltages "Vpass". As discussed herein, Vread and/or Vpass can be compensated for temperature according to one or more embodiments of the present disclosure. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, data stored in the selected cell can be based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2:
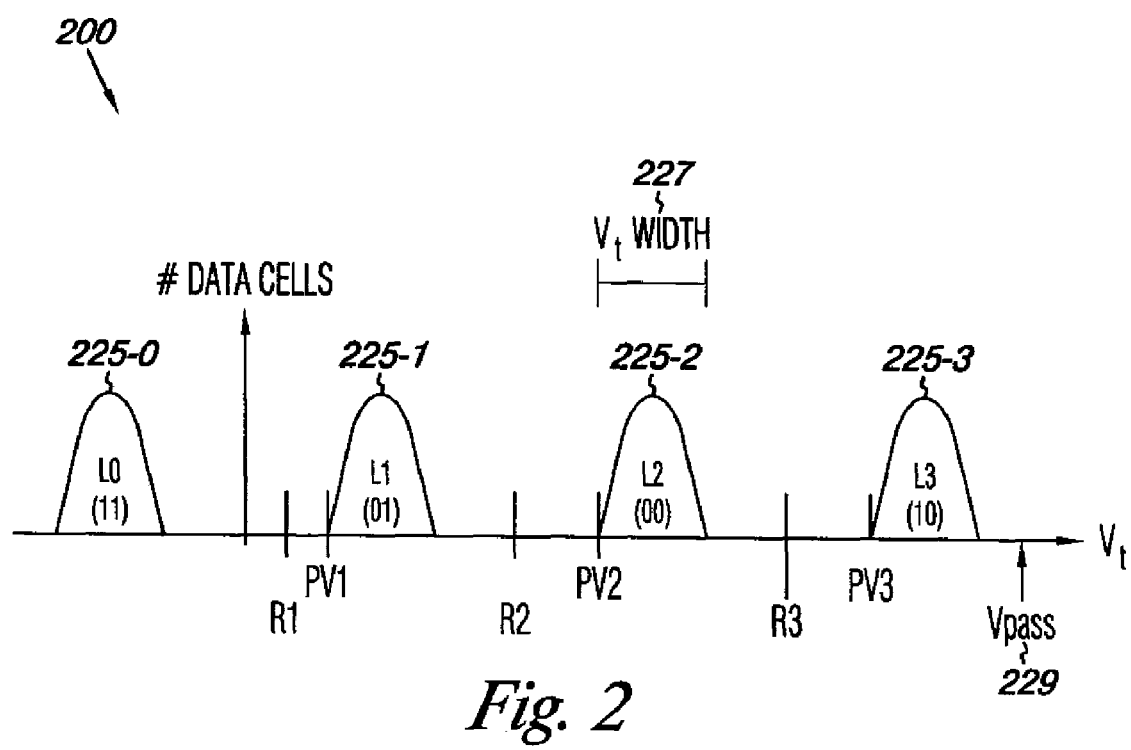
FIG. 2 illustrates a diagram of a number of threshold voltage distributions, sensing voltages, and program verify voltages in accordance with one or more embodiments of the present disclosure.

FIG. 2 illustrates a diagram 200 of a number of threshold voltage distributions, sensing voltages, and program verify voltages in accordance with one or more embodiments of the present disclosure. The example shown in FIG. 2 represents a two-bit, e.g., four-state, memory cell. The threshold voltage (Vt) distributions 225-0, 225-1, 225-2, and 225-3 represent four states, e.g., L0, L1, L2, and L3, respectively, to which the memory cells can be programmed. In the example illustrated in FIG. 2, Vt distribution 225-3 can be referred to as a maximum Vt ($Vt_{max}$) to which a cell can be programmed because it is the Vt with the largest magnitude. In operation, the memory cells in a selected block can be erased together such that they have a threshold voltage level within Vt distribution 225-0 prior to being programmed. As such, distribution 225-0 can be referred to as an erased state and can represent a particular stored data state (L0), e.g., stored data such as binary "11". State L1 can correspond to data 01, state L2 can correspond to data 00, and state L3 can correspond to data 10. As will be appreciated, embodiments are not limited to this example of two-bit memory cells.

The Vt distributions 225-0, 225-1, 225-2, and 225-3 can represent a number of cells that are programmed to corresponding states, where the height of Vt distribution curve indicates a number of cells, e.g., memory cells such as data cells, programmed to a particular voltage within the Vt distribution, on average. The width of the Vt distribution curve ("$Vt_{width}$" 227) indicates the range of voltages that represent a particular state, e.g., the width of the Vt distribution curve 225-2 for L2 represents the range of voltages that correspond to data 00.

A number of sensing voltages are illustrated in FIG. 2. Such sensing voltages can include program verify voltages and/or read voltages, among others. For example, program verify voltages PV1, PV2, and PV3 are illustrated, as well as read voltages R1, R2, and R3. A program verify operation can be performed after one or more programming pulses to help determine whether a memory cell has been programmed within a desired Vt to help prevent the memory cell from receiving further programming pulses, e.g., "over programming." For instance, memory cells to be programmed to the L1 state can be program verified with a voltage PV1. Similarly, program verify voltage PV2 can be used with cells programmed to L2 and PV3 can be used with cells programmed to L3.

In the example illustrated in FIG. 2, the voltage levels R1, R2, and R3 represent sensing voltages, e.g., read voltages, that can be used to distinguish between the data states L0, L1, L2, and L3 during a read operation. In a sensing operation performed on a selected memory cell in a NAND string, the unselected memory cells of the string can be biased with a pass voltage (Vpass) 229 so as to be in a conducting state. As illustrated in FIG. 2, Vpass 229 can have a greater magnitude than $Vt_{max}$. When all cells in a string are in a conductive state, current can flow between the source line contact at one end of the string and a drain line contact at the other end of the string. As such, the state of the selected cell can be determined based on the current and/or voltage sensed on a bit line corresponding to a particular string when the selected cell begins to conduct. For example, the logical value of data stored in a selected cell can be determined based on whether the bit line current changes by a particular amount, or reaches a particular level within a given time period. Other types of sensing operations are possible as will be understood by one of ordinary skill in the art.

The quantity of sensing operations performed on a particular memory cell, without erasing and reprogramming the particular memory cell, can affect performance characteristics. As an example, a "read disturb" mechanism is a perturbation of a memory cell that can be caused by performing multiple sensing operations on the cell. As described herein, during a sensing operation, access gates of unselected memory cells can be biased with Vpass 229, which can be a higher voltage than $Vt_{max}$. Although Vpass 229 can be lower than a voltage associated with a programming pulse, repeatedly applying Vpass 229 to a particular memory cell, e.g., during multiple sensing operations, can perturb the Vt of the particular memory cell in a similar fashion to a programming pulse. That is, repeatedly applying Vpass 229 to the access gate of the particular memory cell can increase the Vt of the cell. In some instances, such a perturbation can change the state of the particular memory cell. For example, if the particular memory cell were programmed to a Vt 225-1 associated with state L1/data 01, repeatedly applying Vpass to the particular cell could cause the Vt of the particular cell to increase to the point where it was higher than R2, or even within the Vt 225-2 associated with state L2/data 00 as illustrated in FIG. 2. As the reader will appreciate, such a perturbation could cause sensing errors, e.g., data programmed as 01 could be sensed as 00.

Another example of negative effects associated with read disturb can result in sensing errors other than that of a single cell error. For instance, a particular cell programmed to a Vt 225-3 associated with state L3/data 10, as illustrated in FIG. 2, could be perturbed such that the Vt of the particular cell increased above Vpass 229. In such an instance, Vpass 229 could then be insufficient to cause the particular cell to conduct, e.g., "turn on." Accordingly, a sensing operation performed on a string of memory cells, e.g., string 109-1 in FIG. 1, including the particular cell could result in a sensing error. That is, no cell on the string could be sensed, because the particular cell may not conduct when Vpass 229 is applied to it. In such an instance, current could not flow through the string to a bit line and/or sensing circuitry to allow for sensing one or more cells on the string.

According to one or more embodiments of the present disclosure, it can be beneficial to apply a dynamic pass voltage to unselected access lines while one or more sensing voltages are applied to one or more selected memory cells, e.g., during a sensing operation. Such embodiments can be advantageous in helping to reduce the effects of a read disturb mechanism, for instance, by decreasing the magnitude of the pass voltage, thereby decreasing the statistical occurrence of perturbing the Vt of an unselected memory cell after multiple sensing operations. That is, even a small decrease in pass voltage can result in fewer instances of Vt perturbations that are significant enough to cause sensing errors. As described herein, a dynamic pass voltage can be a pass voltage that is not constant. For example, a dynamic pass voltage can decrease during its application, e.g., as a negatively ramping pass voltage, for example, from 5.8V to 5.6V. In one or more embodiments a dynamic pass voltage can be a decreasing pass voltage. In one or more embodiments a dynamic pass voltage can be an increasing pass voltage.

Figure 3:
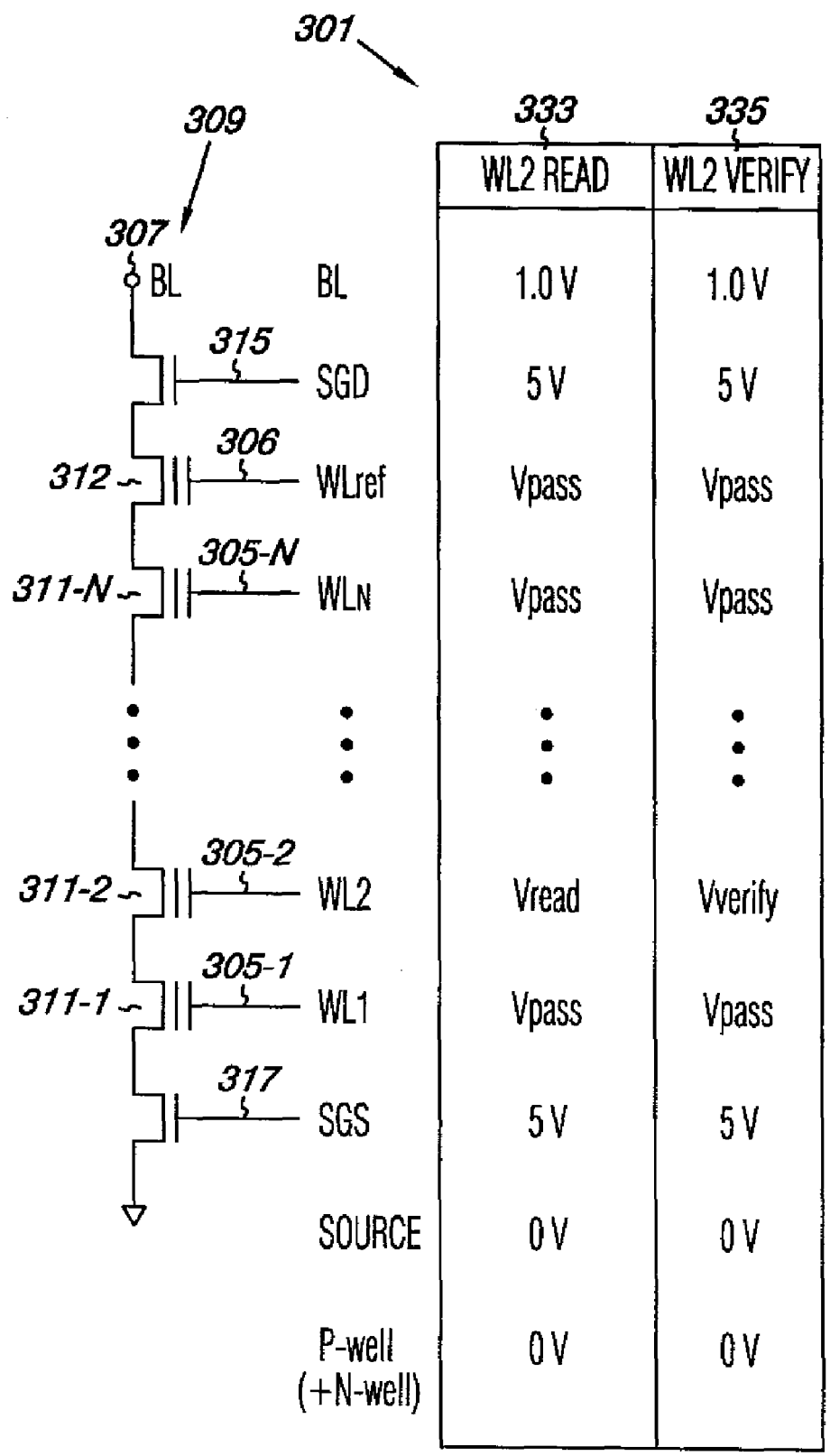
FIG. 3 illustrates a table of operating voltages associated with performing various operations on memory cells in accordance with one or more embodiments of the present disclosure.

FIG. 3 illustrates a table 301 of operating voltages associated with performing various operations on memory cells in accordance with one or more embodiments of the present disclosure. Table 301 illustrates operating voltages, e.g., bias conditions, associated with performing a sensing operation, e.g., a read operation 333 (WL2 READ) or a program verify operation 335 (WL2 VERIFY) on one or more data cells coupled to a selected word line, e.g., word line 305-2 (WL2) in this example. In one or more embodiments, a sensing voltage, e.g., a read voltage Vread and/or a program verify voltage Vverify, can be applied as a stepping voltage, a ramping voltage, e.g., a positively ramping sensing voltage that increases linearly, or as separate, discrete voltages, in accord with a number of sensing methods, as will be understood by one of ordinary skill in the art. Embodiments are not limited to a particular type of sensing operation.

As shown in table 301, the read operation 333 performed on data cell 311-2 coupled to selected word line 305-2 includes applying one or more read voltages (Vread), e.g., R1, R2, or R3 shown in FIG. 2, to the selected word line 305-2. The read operation 333 can include applying a dynamic pass voltage (Vpass) to unselected word lines such that unselected cells in string 309 operate in a conducting mode, e.g., the unselected cells in string 309 are turned on and pass current without regard to the Vt level of the unselected cells. In the example illustrated in table 301, the unselected word lines, e.g., the unselected word lines 305-1 through 305-N, except word line 305-2, and 306, are biased at a dynamic pass voltage Vpass during the read operation 333. Unselected word lines can be biased with, e.g., as applied by control circuitry, a dynamic pass voltage at substantially the same time as one or more selected word lines are biased with one or more sensing voltages, e.g., Vread and/or Vverify.

In the example shown in table 301, the read operation 333 includes biasing the bit line 307 (BL) at 1.0V, biasing the common source line (SOURCE) at 0V, and biasing a well region (P-well) associated with the string 309 at 0V. As one of ordinary skill in the art will appreciate, the bit line 307, associated with one or more selected memory cells, can be precharged in a read operation, e.g., to 1.0V. As will also be appreciated, sensing operations can include allowing the bit line to discharge to help determine the state of a selected memory cell. According to one or more embodiments of the present disclosure, the dynamic pass voltage can be decreased while the one or more sensing voltages are applied after a bit line begins to discharge during a sensing operation. In one or more embodiments, control circuitry can be configured to apply one or more sensing voltages to a word line coupled to a selected memory cell until the bit line discharges from a first precharged voltage to a second discharged voltage. One or more embodiments can include decreasing the dynamic pass voltage by an amount approximately equal to and/or in proportion to an amount by which the one or more bit lines discharge. For example, control circuitry can be configured to decrease the dynamic pass voltage from a first pass voltage to a second pass voltage while the bit line discharges.

In the table 301 for string 309, drain select line 315 and the source select line 317 are biased at a voltage, e.g., 5V, which is sufficient to turn on the respective drain select gate (SGD) and source select gate (SGS) transistors. Under the biasing conditions shown in table 301, voltage and/or current levels on bit line 307 in response to one or more sensing voltages, e.g., read voltage (Vread), can be sensed by sensing circuitry (not shown) in order to determine a particular state, e.g., state L0, L1, L2, or L3 shown in FIG. 2, of the selected memory cell 305-2.

Table 301 also illustrates bias conditions that can be associated with performing a program verify operation 335 (VERIFY WL2) on one or more memory cells coupled to a selected word line, e.g., word line 305-2 (WL2), in accordance with one or more embodiments of the present disclosure. As shown in table 301, the program verify operation 335 can be performed on memory cell 305-2 coupled to selected word line 305-2 and can include applying one or more program verify voltages (Vverify), e.g., PV1 shown in FIG. 2, to the selected word line 305-2. As illustrated in table 301, the read operation 335 can include biasing the unselected word lines 305-1, . . . , 305-N, e.g., word lines coupled to unselected memory cells, at a dynamic pass voltage Vpass.

As shown in table 301, the program verify operation 335 can include biasing the bit line 307 (BL) at 1.0V, biasing the common source line (SOURCE) at 0V, and biasing the well region (P-well) associated with the string 309 at 0V. During program verify operation 335, the drain select line 315 and the source select line 317 can be biased at a voltage, e.g., 5V in this example, sufficient to turn on the respective SGD and SGS transistors. In one or more embodiments, the drain select gate and/or the source select gate transistors can be biased at an approximately constant voltage while a dynamic pass voltage is applied to unselected memory cells. Under the biasing conditions shown in table 301, voltage and/or current levels on bit line 307 in response to the particular applied program verify voltage Vverify, can be sensed by sensing circuitry (not shown) in order to determine whether the selected memory cell 311-2 has been programmed to at least a particular Vt level.

The determination of whether or not the selected memory cell, e.g., 311-2, has been programmed to at least a particular Vt level in response to the program verify, e.g., 335, can be based on whether or not the memory cell conducts current in response to the particular applied program verify voltage, e.g., Vverify. For instance, if sensing of the bit line 307 determines the selected memory cell 311-2 to be in a non-conducting state, e.g., turned off, in response to the applied program verify voltage Vverify, then the memory cell has been programmed to a Vt level greater than Vverify. If sensing of the bit line 307 determines the selected memory cell 311-2 to be in a conducting state, e.g., turned on, in response to the applied program verify voltage Vverify, then the memory cell has not been programmed to a Vt level greater than Vverify.

Embodiments of the present disclosure are not limited to the example voltages shown in table 301. For instance, embodiments of the present disclosure are not limited to read operations in which the bit line 307 (BL) is biased at 1.0V and in which the common source line (SOURCE) and the well region (P-well) are biased at 0V, e.g., a ground voltage. For instance, in various embodiments, the bit line sensing voltage, e.g., the voltage applied to BL 307 during a read or program verify operation, can be within a range of about 0.1V to 6V. In various embodiments, the SOURCE can be biased at a voltage of between about 0V and about 6V during a sensing operation such as a read or program verify operation. Varying the bit line sensing voltage and/or common source line voltage can be used to extend the usable Vt range to negative values, i.e., to expand the usable programming window. Such sensing can be referred to as sensing with back-bias and can extend the programming window from a 0V to 6V window to a −6V to 6V window, for instance.

FIG. 4 illustrates a prior art diagram 400 of a pass voltage 429 and bit line voltage 437 during a sensing operation. The example sensing operation is of a single level cell (SLC), e.g., a cell capable of being programmed to one of two states. As illustrated, a bit line voltage 437 may either remain constant 437-1 to indicate that a selected memory cell is in a first state, or the bit line voltage may decrease 437-2 to indicate that the selected memory cell is in a second state. According to some previous approaches, a pass voltage 429 applied to unselected word lines, and accordingly to access gates of unselected memory cells, may remain constant.

A description of applying pass voltages during a sensing operation is provided in U.S. Pat. No. 7,342,831 to Mokhlesi et al. Mokhlesi appears to teach applying a temperature compensated pass voltage, where the temperature compensated pass voltage may vary for different memory cells, e.g., depending on the position of a memory cell. For example, Mokhlesi appears to teach varying the pass voltage applied to an unselected memory cell based on word line position. Although Mokhlesi appears to teach applying different pass voltages to different word lines and/or memory cells, Mokhlesi teaches applying a constant pass voltage to any given word line and/or memory cell. That is, Mokhlesi appears to teach applying different, constant pass voltages to different word lines and/or memory cells.

FIG. 5 illustrates a diagram 500 of a dynamic pass voltage 529 and a bit line voltage 537 in accordance with one or more embodiments of the present disclosure. As the reader will appreciate, pass voltage 529 can be a dynamic pass voltage that can negatively ramp, e.g., linearly, from a first voltage level 529-1 to a second voltage level 529-2 between time t0 and t1 as illustrated in FIG. 5. Such a reduction in pass voltage 529 can reduce an effective value of the pass voltage 529 that is applied to unselected memory cells. For example, the effective pass voltage 529 can be equal to: (the first voltage 529-1+the second voltage 529-2)/2.

In one or more embodiments, the dynamic pass voltage 529 can decrease in proportion to the decrease in bit line voltage 537-2. In one or more embodiments, control circuitry can be configured to decrease the dynamic pass voltage, e.g., linearly, in proportion to a decrease in voltage on a bit line while one or more sensing voltages are applied to a selected word line. For example, the dynamic pass voltage 529 can decrease by at least 200 millivolts between t0 and t1. The time from t0 to t1 can represent a time for sensing a selected memory cell such as a time during which one or more sensing voltages are applied to a selected memory cell and/or a time during which a bit line discharges to allow sensing circuitry to sense a state of a selected memory cell.

In some embodiments, the dynamic pass voltage 529 can decrease from a first pass voltage 529-1 to a second pass voltage 529-2, where the first pass voltage 529-1 can be compensated for a number of factors including body effect, changes in Vt due to an overdriven voltage, and/or temperature, among other considerations. In one or more embodiments, either or both of the first pass voltage 529-1 and the second pass voltage 529-2 can be so compensated.

In one or more embodiments, a method for operating a memory device can include applying a sensing voltage to a selected word line for a particular time to sense a selected memory cell. Such a method can also include applying a negatively ramping dynamic pass voltage to a number of unselected word lines during at least a portion of the particular time to put a number of unselected memory cells in a conductive state.

In one or more embodiments, a method for sensing memory cells can include applying one or more sensing voltages to an access gate of a selected memory cell. The method can also include applying a dynamic pass voltage to access gates of one or more unselected memory cells coupled in series to the selected memory cell. Applying the dynamic pass voltage can include decreasing the dynamic pass voltage while applying the one or more sensing voltages. Applying the dynamic pass voltage can also include starting the dynamic pass voltage at an initial temperature compensated voltage.

Body effect can include a difference in potential between a source voltage (of a particular memory cell) and a voltage on the substrate associated with the particular memory cell. During a program verify operation, a source voltage of unselected cells can be relatively low, e.g., close to 0V. During a read operation, a source voltage of unselected cells can be similar to the bit line voltage 537. Such an occurrence can cause the Vt of unselected cells to increase during a read operation due to body effect. According to one or more embodiments of the present disclosure, the initial dynamic pass voltage can be compensated for body effect, e.g., increased.

An overdrive voltage may be defined as the difference between the voltage applied to a control gate of a memory cell, and the Vt of the particular memory cell (Vg–Vt). In order to provide sufficient overdrive voltage to help ensure that unselected memory cells conduct, the initial dynamic Vpass can be greater than the sum of a source voltage and a Vt of unselected cells (Vs+Vt). However, a high overdrive voltage may lead to an increased tendency towards an increased read disturb mechanism. In a sensing operation, such as a read or program verify operation, bit line and/or channel voltages of strings can change, e.g., as shown at bit line voltage 537-2. According to one or more embodiments of the present disclosure, the dynamic pass voltage 529 can be reduced during a sensing operation, e.g., at the same rate as the discharge of the bit line voltage 537-2, without reducing the overdrive voltage. According to some previous approaches, applying a constant Vpass may result in an effective increased overdrive voltage, which may lead to an increase in a read disturb mechanism.

As temperature increases, cell threshold voltages can decrease. Accordingly, the dynamic pass voltage, including an initial and/or final voltage, can be dynamically compensated for operating temperature. Dynamic compensation can include altering an amount by which the dynamic pass voltage is compensated during operation of a memory device. For example, an initial dynamic Vpass could be set at 6.0V for a "cold" temperature, at 5.9V for a "room" temperature, and at 5.8V for a "hot" temperature. Accordingly, a sensing operation can include starting the negatively ramping dynamic pass voltage at an initial pass voltage compensated for changes in threshold voltage due to temperature. In the same example, after negatively ramping the dynamic Vpass during a sensing operation, Vpass could reach 5.8V for a "cold" temperature, 5.7V for a "room" temperature, and 5.6V for a "hot" temperature. The use of the terms, "cold," "room," and "hot," herein with respect to temperature are meant only to provide relative differences between the example temperatures. They are not meant to correspond to an actual "room" (or other) temperature. Many semiconductor memory devices operate at temperatures between approximately –40 C to +85 C, for example. Furthermore, the use of specific voltages with respect to this example should not be interpreted in a limiting sense. One of ordinary skill in the art could tailor embodiments of the present disclosure to appropriate operating voltages for a particular memory device.

Even a small reduction in pass voltage, e.g., in the order of a hundred millivolts, may exponentially reduce the effects of a read disturb mechanism. One or more embodiments of the present disclosure can compensate a dynamic pass voltage for operating temperature by checking an operating temperature for one or more of a particular memory cell, a number of memory cells, a memory device, and/or a memory system. Control circuitry can be configured to reduce a dynamic Vpass, including a first dynamic Vpass and second dynamic Vpass (initial and final pass voltages) in proportion to an increase in operating temperature. In one or more embodiments, the first dynamic Vpass and the second dynamic Vpass can be decreased by a same amount. In one or more embodiments, the first dynamic Vpass and the second dynamic Vpass values can be adjusted by different amounts as well.

In one or more embodiments, the first dynamic pass voltage 529-1 of the dynamic pass voltage, e.g., the initial dynamic pass voltage, can be applied at an amount approximately equal to: $PV_{max}+VT_{width}+\gamma^*(\sqrt{1+V_{BL}})+V_s+Vt_{max}$. As described above, $PV_{max}$ can be a verify voltage for a maximum threshold voltage that corresponds to a data state ($Vt_{max}$). Vpass can be greater than the verify voltage of the highest Vt. $Vt_{width}$ can be a voltage range of a threshold voltage distribution. Due to different individual memory cells having different responses to programming, the $Vt_{width}$ can help to account for variations in a voltage to which cells are programmed for a given state. Vpass can be greater than the combination of $PV_{max}+Vt_{width}$ to help ensure that it causes a cell to conduct. $V_{BL}$ can be a voltage on a bit line associated with the string of memory cells to which the dynamic pass voltage is applied, and Vs can be a source voltage.

The coefficient $\gamma$ can be a body effect parameter. In some instances, $\gamma$ can be equal to $(t_{ox}/\epsilon_{ox})^*\sqrt{(2^*q^*\epsilon_{si}^*N_A)}$, where $t_{ox}$ represents the oxide thickness, $\epsilon_{ox}$ represents the oxide permittivity, q represents the charge of an electron, $\epsilon_{si}$ represents the permittivity of silicon, and $N_A$ represents a doping concentration. Accordingly, the term $\gamma^*(\sqrt{(1+V_{BL})}-1)$ can represent compensation for body effect, while the term $V_s+Vt_{max}$ can represent a compensation factor to provide sufficient overdrive voltage, as described above.

Figure 6:
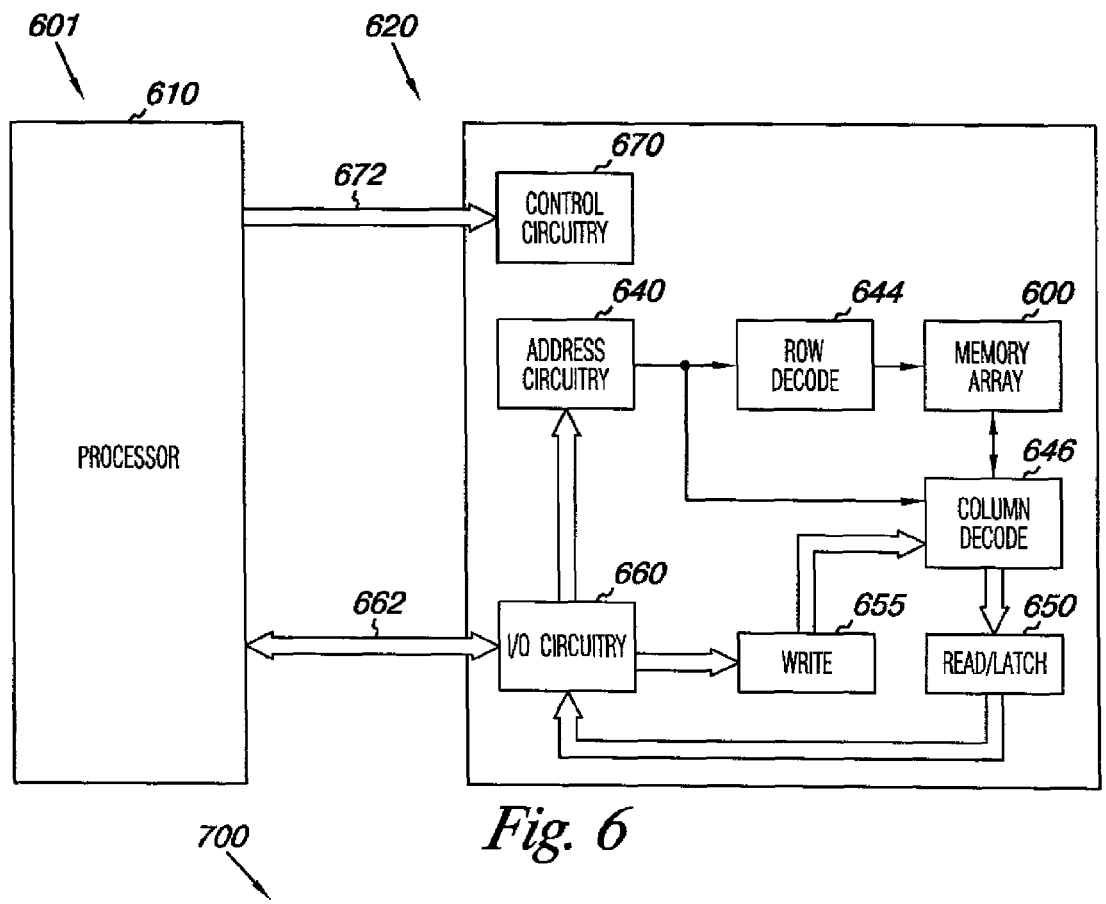
FIG. 6 is a functional block diagram of an electronic memory system having at least one memory device operated in accordance with one or more embodiments of the present disclosure.

FIG. 6 is a functional block diagram of an electronic memory system 600 having at least one memory device 620 operated in accordance with one or more embodiments of the present disclosure. Memory system 600 includes a processor 610 coupled to a non-volatile memory device 620 that includes a memory array 630 of non-volatile cells. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

The memory device 620 includes an array of non-volatile memory cells 630, which can be floating gate flash memory cells with a NAND architecture. The control gates of memory cells of a "row" are coupled with a word line, while the drain regions of the memory cells of a "column" are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 6 includes address circuitry 640 to latch address signals provided over I/O connections 662 through I/O circuitry 660. Address signals are received and decoded by a "row" decoder 644 and a "column" decoder 646 to access the memory array 630. In light of the present disclosure, it will be appreciated by those skilled in the art that the number of address input connections depends on the density and architecture of the memory array 630 and that the number of addresses increases with both increased numbers of memory cells and increased numbers of memory blocks and arrays.

The memory device 620 senses data in the memory array 630 by sensing voltage and/or current changes in the memory array "columns" using sense/buffer circuitry that in this embodiment can be read/latch circuitry 650. The read/latch circuitry 650 can read and latch a page, e.g., a "row", of data from the memory array 630. I/O circuitry 660 is included for bi-directional data communication over the I/O connections 662 with the processor 610. Write circuitry 655 is included to write data to the memory array 630.

Control circuitry 670 decodes signals provided by control connections 672 from the processor 610. These signals can include chip signals, write enable signals, and address latch signals that are used to control the operations on the memory array 630, including data sensing, data write, and data erase operations. The control circuitry 670 can apply a dynamic pass voltage to one or more unselected access lines during a sensing operation. In one or more embodiments, the control circuitry 670 is responsible for executing instructions from the processor 610 to perform the operations according to embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
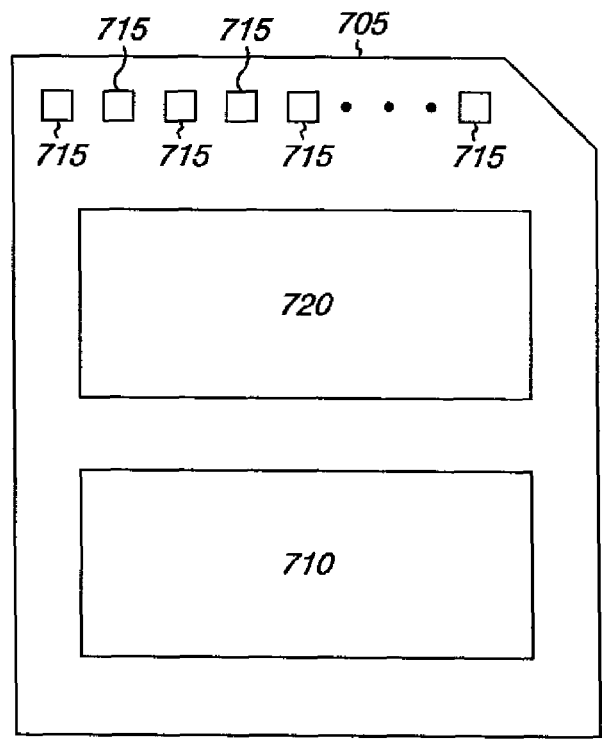
FIG. 7 is a functional block diagram of a memory module having at least one memory device operated in accordance with one or more embodiments of the present disclosure.

FIG. 7 is a functional block diagram of a memory module 700 having at least one memory device 710 operated in accordance with one or more embodiments of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In one or more embodiments, memory module 700 will include a housing 705 (as depicted) to enclose one or more memory devices 710, though such a housing is not essential to all devices or device applications. At least one memory device 7 L0 includes an array of non-volatile multilevel memory cells that can be sensed according to embodiments described herein. Where present, the housing 705 includes one or more contacts 715 for communication with a host device. Examples of host devices include digital cameras, digital recording and playback devices, PDAs, personal computers, memory card readers, interface hubs and the like. For one or more embodiments, the contacts 715 are in the form of a standardized interface. For example, with a USB flash drive, the contacts 715 might be in the form of a USB Type-A male connector. For one or more embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For one or more embodiments, the additional circuitry 720 may include control circuitry, such as a memory controller, for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

The present disclosure includes methods, devices, modules, and systems for operating memory cells. One method embodiment includes applying sensing voltages to selected access lines for sensing selected memory cells. The method also includes applying a dynamic pass voltage to unselected access lines while the sensing voltages are applied.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising:
   biasing an access gate of a selected memory cell with a sensing voltage for a particular time;
   biasing an access gate of an unselected memory cell coupled in series with the selected memory cell with a pass voltage; and
   decreasing the pass voltage during at least a portion of the particular time.

2. The method of claim 1, further comprising biasing an access gate of each unselected memory cell coupled in series with the selected memory cell with the pass voltage.

3. The method of claim 1, further comprising sensing a data line coupled to the selected memory cell and the unselected memory cell.

4. The method of claim 1, wherein decreasing the pass voltage during at least a portion of the particular time comprises decreasing the pass voltage while a data line coupled to the selected memory cell discharges.

5. The method of claim 1, wherein decreasing the pass voltage comprises decreasing the pass voltage by an amount approximately equal to an amount by which a data line coupled to the selected memory cell discharges.

6. The method of claim 1, wherein decreasing the pass voltage comprises decreasing the pass voltage by an amount in proportion to an amount by which a data line coupled to the selected memory cell discharges.

7. The method of claim 1, wherein decreasing the pass voltage comprises decreasing the pass voltage after a data line coupled to the selected memory cell begins to discharge.

8. The method of claim 1, wherein biasing the access gate of the selected memory cell comprises biasing the access gate of the selected memory cell until a data line coupled to the selected memory cell discharges from a precharge voltage to a discharged voltage.

9. The method of claim 1, wherein biasing the access gate of the unselected memory cell with a pass voltage comprises biasing the access gate of the unselected memory cell with a first pass voltage, and wherein decreasing the pass voltage during the at least a portion of the particular time comprises decreasing the pass voltage from the first pass voltage to a second pass voltage.

10. The method of claim 9, further comprising compensating the first pass voltage for at least one of:
    body effect;
    changes in threshold voltage due to an overdriven voltage; and
    temperature.

11. The method of claim 9, further comprising compensating the second pass voltage for at least one of:
    body effect;
    changes in threshold voltage due to an overdriven voltage; and
    temperature.

12. The method of claim 1, further comprising biasing a data line coupled to the selected memory cell and the unselected memory cell with a data line sensing voltage.

13. The method of claim 12, further comprising varying the data line sensing voltage.

14. The method of claim 1, wherein biasing the access gate of the selected memory cell with a sensing voltage comprises biasing the access gate of the selected memory cell with a stepping sensing voltage.

15. The method of claim 1, wherein biasing the access gate of the selected memory cell with a sensing voltage comprises biasing the access gate of the selected memory cell with a ramping sensing voltage.

16. The method of claim 1, wherein biasing the access gate of the unselected memory cell with a pass voltage comprises biasing the unselected memory cell at a voltage sufficient to place the unselected memory cell in a conducting state independent of a threshold voltage of the unselected memory cell.

17. The method of claim 1, further comprising compensating the sensing voltage and/or the pass voltage for temperature.

18. The method of claim 1, further comprising compensating the pass voltage for body effect.

19. The method of claim 1, further comprising compensating the pass voltage for changes in threshold voltage due to an overdriven voltage.

20. The method of claim 1, wherein decreasing the pass voltage comprises reducing the pass voltage at a same rate as the discharge of a voltage of a data line coupled to the selected memory cell and the unselected memory cell.

21. A method of operating a memory device, comprising:
    biasing an access gate of a selected memory cell coupled in series with the selected memory cell with a sensing voltage for a particular time;
    biasing an access gate of an unselected memory cell with a pass voltage; and
    linearly decreasing the pass voltage during at least a portion of the particular time.

22. A memory device, comprising:
    an array of memory cells;
    control circuitry coupled to the array and configured to:
       bias an access gate of a selected memory cell of the array with a sensing voltage for a particular time;
       bias an access gate of an unselected memory cell of the array with a pass voltage, the unselected memory cell being coupled in series with the selected memory cell; and
       decrease the pass voltage during at least a portion of the particular time.

23. The memory device of claim 22, wherein at least one of the access gate of the selected memory cell and the access gate of the unselected memory cell comprises a control gate.

24. The memory device of claim 22, wherein the control circuitry is further configured to bias a common source line coupled to the selected memory eel and the unselected memory cell with a common source line voltage.

25. The memory device of claim 24, wherein the control circuitry is further configured to vary the common source line voltage.

* * * * *

UNITED STATES PATENT AND TRADEMARK OFFICE
CERTIFICATE OF CORRECTION

PATENT NO.        : 8,120,952 B2                                    Page 1 of 1
APPLICATION NO.   : 12/721693
DATED             : February 21, 2012
INVENTOR(S)       : Jin-Man Han It is certified that error appears in the above-identified patent and that said Letters Patent is hereby corrected as shown below:

In column 14, lines 37-44, in Claim 21, delete "21. A method of operating a memory device, comprising:
  biasing an access gate of a selected memory cell coupled in series with the selected memory cell with a sensing voltage for a particular time;
  biasing an access gate of an unselected memory cell with a pass voltage; and
linearly decreasing the pass voltage during at least a portion of the particular time." and insert -- 21. A method of operating a memory device, comprising:
  biasing an access gate of a selected memory cell with a sensing voltage for a particular time;
  biasing an access gate of an unselected memory cell coupled in series with the selected memory cell with a pass voltage; and
    linearly decreasing the pass voltage during at least a portion of the particular time. --.

In column 14, line 61, in Claim 24, delete "eel" and insert -- cell --, therefor.

Signed and Sealed this
Seventeenth Day of April, 2012

David J. Kappos
*Director of the United States Patent and Trademark Office*